United States Patent
Lee et al.

(10) Patent No.: US 6,806,708 B1
(45) Date of Patent: Oct. 19, 2004

(54) MULTI-COIL RECONSTRUCTION OF MRI SIGNALS USING LINEAR PHASE MULTIPLIED DATA WITH SEPARATE DEMODULATORS FOR EACH COIL

(75) Inventors: Jin Hyung Lee, Menlo Park, CA (US); John M. Pauly, Redwood City, CA (US); Dwight G. Nishimura, Palo Alto, CA (US)

(73) Assignee: The Board of Trustees of the Leland Standford Junior University, Palo Alto, CA (US)

( * ) Notice: Subject to any disclaimer, the term of this patent is extended or adjusted under 35 U.S.C. 154(b) by 0 days.

(21) Appl. No.: 10/464,296

(22) Filed: Jun. 17, 2003

(51) Int. Cl.[7] ................................................. G01V 3/00
(52) U.S. Cl. ........................................ 324/307; 324/309
(58) Field of Search ................................. 324/307, 309, 324/312, 314, 318, 322

(56) References Cited

U.S. PATENT DOCUMENTS 6,621,433 B1 * 9/2003 Hertz .......................... 341/139
6,650,118 B2 * 11/2003 Leussler ...................... 324/318

OTHER PUBLICATIONS

Griswold et al., "*Partially Parallel Imaging with Localized Sensitivities (PILS)*", Magnetic Resonance in Medicine, May 16, 2000, vol. 44, pp 602–609.

Madore, Bruno and Pelc, Norbert J., "*SMASH and SENSE: Experimental and Numerical Comparisons*", Magnetic Resonance in Medicine, Dec. 22, 2000, vol. 45, pp 1103–1111.

Tsai, Chi–Ming and Nishimura, Dwight G., "*Reduced Aliasing Artifacts Using Variable–Density k–Space Sampling Trajectories*", Magnetic Resonance in Medicine, Nov. 11, 1999, vol. 43, pp 452–458.

* cited by examiner

*Primary Examiner*—Louis Arana
(74) *Attorney, Agent, or Firm*—Beyer Weaver & Thomas LLP

(57) ABSTRACT

Imaging time using PILS is reduced by using multiple coils with localized sensitivities with each coil having a separate demodulation channel thereby permitting parallel signal processing and image reconstruction. Images from the multiple coils are then combined to form an image with a larger field of view (FOV).

10 Claims, 3 Drawing Sheets

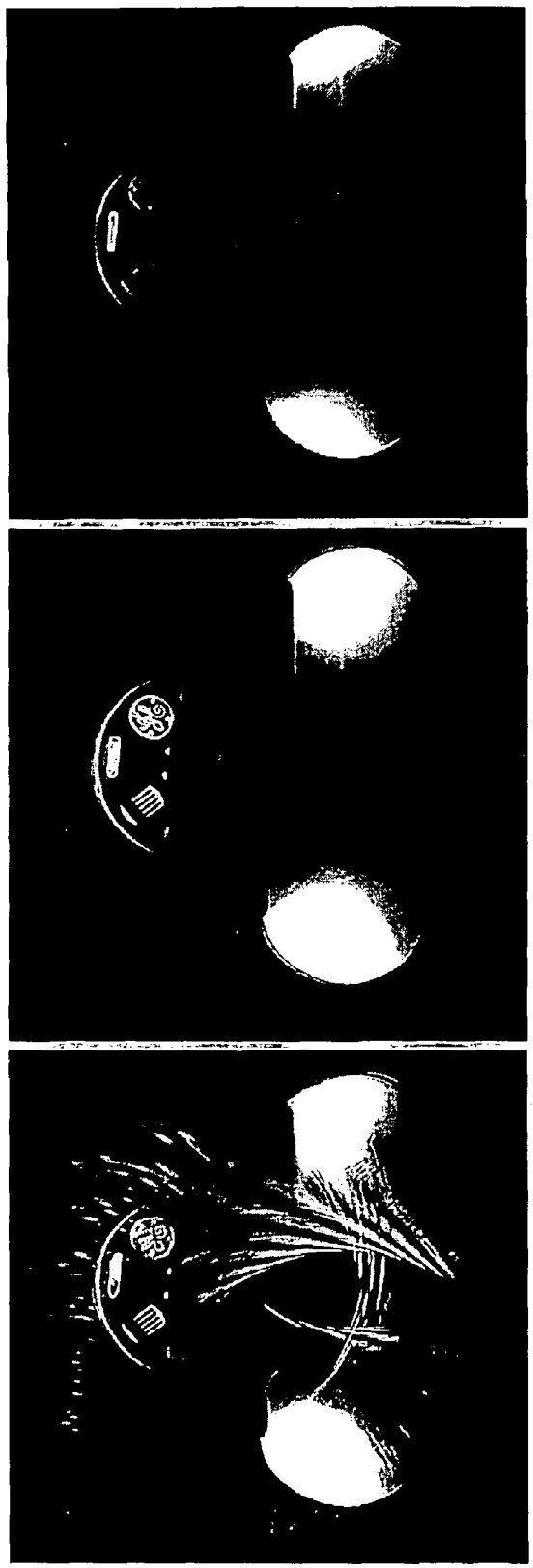

MULTI-COIL RECONSTRUCTION OF MRI SIGNALS USING LINEAR PHASE MULTIPLIED DATA WITH SEPARATE DEMODULATORS FOR EACH COIL

GOVERNMENT RIGHTS

The U.S. government has rights in the claimed invention pursuant to NIH contract number HL39297 with Stanford University.

BACKGROUND OF THE INVENTION

This invention relates generally to magnetic resonance imaging (MRI), and more particularly, the invention relates to reconstruction of under-sampled k-space trajectories.

MRI signals for reconstructing an image of an object are obtained by placing the object in a magnetic field, applying magnetic gradients for slice selection, applying a magnetic excitation pulse to tilt nuclei spins in the desired slice, and then detecting MRI signals emitted from the tilted nuclei spins while applying readout gradients. The detected signals can be envisioned as traversing lines in a Fourier transformed space (k-space) with the lines aligned and spaced parallel in Cartesian trajectories and emanating from the origin of k-space in spiral trajectories.

A parallel imaging technique, referred to as partially parallel imaging with localized sensitivities or PILS is known for fast imaging using multiple receiver coils. See Griswold et al., "Partially Parallel Imaging with Localized Sensitivities (PILS)," Mag Reson Med 44:602–609 (2000) and Madore et al., "SMASH and SENSE: Experimental and Numerical Comparisons," Mag Reson Med 45:1103–1111 (2001), for example. In PILS, imaging time is reduced by encoding for a smaller field of view (FOV) based on a single coil's region of sensitivity. Data read in from each component coil is separately reconstructed to form a small-FOV image that covers the sensitivity region for each coil. These component images are then pasted together to generate the large-FOV image. The scan is performed by using the same excitation and read out gradients with multiple receiver coils sitting at different locations. The gradients are designed to encode for the size of the FOV covered by the sensitivity region of a single coil. Then, the data from each coil are reconstructed so that each image has the center of the FOV at the center of the sensitivity region of each coil.

With conventional PILS, only one demodulator channel is used for data from all coils. Therefore, the encoding in the readout direction should be designed to cover the full FOV. One reason for this is the use of anti-aliasing filtering after demodulation and before the analog to digital (A/D) conversion. The filtering removes data from one stage that is needed in the next stage. Thus, to enable under-sampling in the readout direction, demodulation must be done sequentially for data from each coil with proper demodulation tailored for each coil. As a result, data acquisition can be less efficient.

Further, when imaging a large FOV, due to the lower limit on the temporal sampling interval, the maximum gradient amplitude is not utilized. Therefore, when imaging a large FOV using PILS, under-sampling in the readout direction, which will allow faster coverage of k-space, is not being exploited. However, if the sampling rate is not high enough to cover the entire FOV of interest in the readout direction, the anti-aliasing filter designed to avoid aliasing for the given sampling rate will filter out signals that are outside of the FOV being encoded. The anti-aliasing filter applied along the spiral readout results in a linear shift-variant response in the image domain. This shift-variant response is illustrated in FIG. 1, which shows the impulse response at four locations. The figure on the left corner shows the four points for which the impulses were applied. The cross-sections of the impulse responses through the center of the impulses parallel to the y axis are plotted in FIG. 1. For signals that are farther away from the center of the FOV, the amplitude is reduced and the response is wider, which results in blurring. This filtering occurs before any processing can be done to increase the FOV using PILS reconstruction.

SUMMARY OF THE INVENTION

In accordance with the invention, a separate demodulation channel is provided for each coil in a multi-coil receiver whereby data for all coils are demodulated in parallel. The demodulation for each received signal depends on the center location of sensitivity for each receiver coil. Since an object being off center can be considered as the signal being shifted in the object domain, the data that is collected in the Fourier domain for each coil will have linear phase multiplied to the data that would have been collected without the shift. For a shift amount of $(x_i, y_i, z_i)$ the linear phase multiplied is $e^{-i2\pi(x \cdot k_x + y \cdot k_y + z \cdot k_z)}$. Therefore, the linear phase is separately unwrapped in the demodulation step for each coil.

The invention object and features thereof will be more readily apparent from the following detailed description and appended claims when taken with the drawings.

BRIEF DESCRIPTION OF THE DRAWINGS

FIGS. 3A, 3B, 3C illustrate magnetic resonance image reconstruction using sum of the squares, PILS reconstruction without the current invention described and PILS reconstruction in accordance with the invention for spiral trajectories with under-sampling in the readout direction and in the interleave spacing.

DETAILED DESCRIPTION OF ILLUSTRATED EMBODIMENTS

Conventional implementation of PILS utilizes a single demodulation channel for data from all coils. Therefore, sampling in the readout direction needs to cover the full FOV. This is due to the presence of the anti-aliasing filter that comes after the demodulation and before the analog to digital conversion. Hence, the digital data acquired cannot be processed to retrieve data that has already been lost in a previous stage. Further, in 2DFT imaging, the anti-aliasing filter is applied in the readout direction to avoid aliasing from signal outside of the total FOV of interest. With just a single demodulation channel, the demodulation cannot be tailored for each receiver coil, as determined by the center frequency and the linear phase that needs to be unwrapped when a coil is not at gradient iso-center. Further, with a single demodulation channel and for a given maximum A/D sampling rate, the readout gradient amplitude must be kept sufficiently low to ensure that the overall FOV of interest for the entire coil array is covered.

Figure 1:
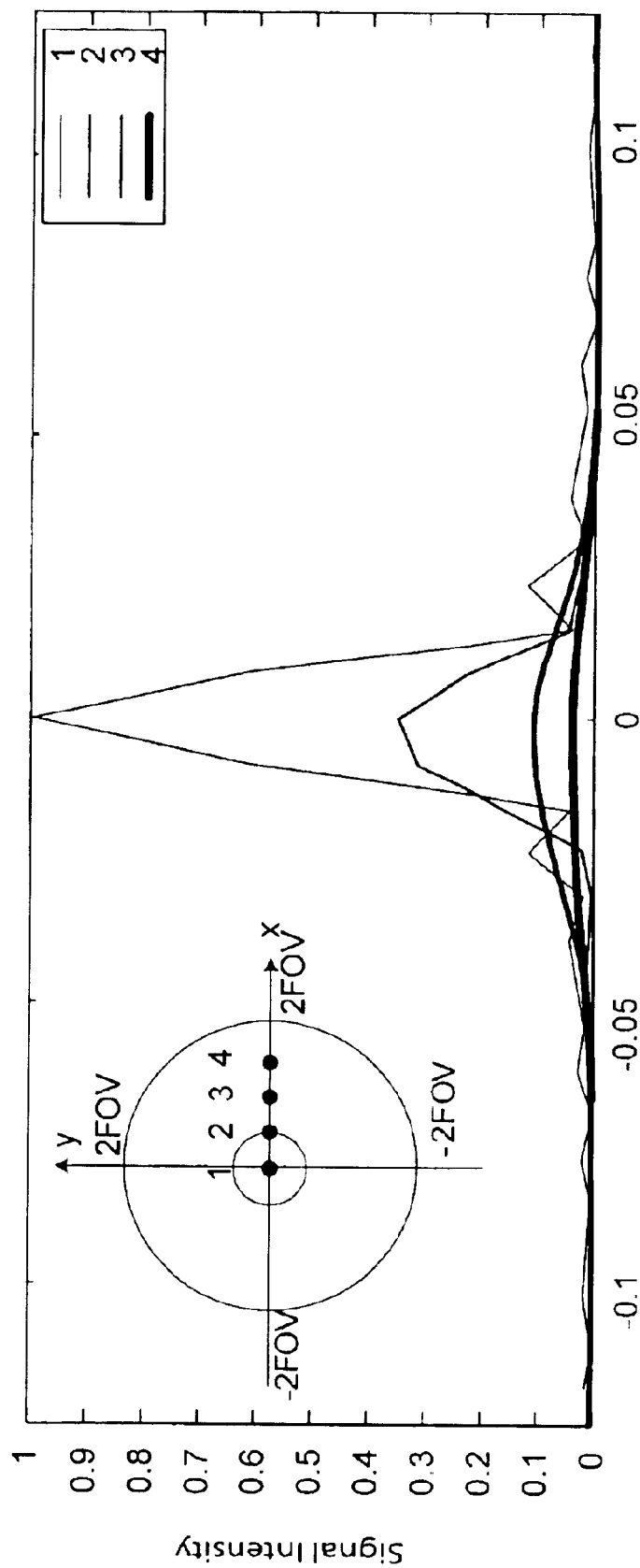
FIG. 1 is a graph illustrating the shift-variant impulse response of an anti-alias filter applied to a spiral readout trajectory. The cross sections of the impulse responses through the center of the impulses are shown for impulses at four different locations.
Figure 2:
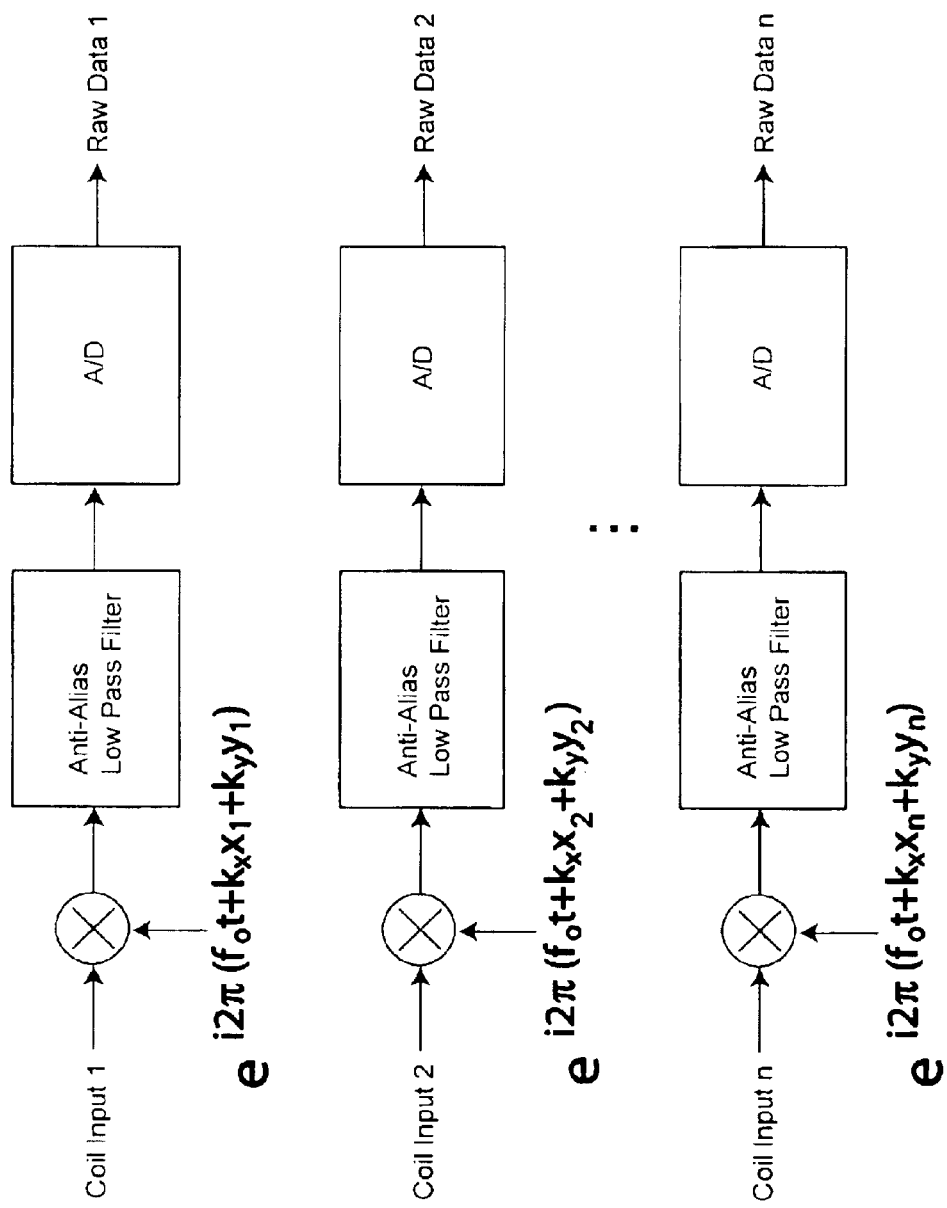
FIG. 2 illustrates separate demodulation circuitry for each of the coils for multiple coil reconstruction in accordance with the invention.

FIG. 2 is a schematic of demodulation circuitry in accordance with the invention in which a separate demodulator is provided for each receiver coil. With the imaged object being off-center, the signal can be considered as the signal being shifted in the object domain, the data that is collected in the Fourier domain for each coil will have linear phase multiplied to the data that would have been collected without the shift. For a shift amount of $(x_i, y_i, z_i)$ the linear phase multiplied is $e^{-i2\pi(x_ik_x+y_ik_y+z_ik_z)}$. This linear phase is multiplied with the signals of each coil in mixers 10 of the demodulators. The linear phase multiplied signals are then passed to anti-aliasing low-pass filters 12 and analog to digital (A/D) converters 14 as the data output for each coil. The multiple coil reconstruction decreases scan time approximately by a factor of n, where n is the number of coils in the array. By employing a separate demodulation channel for each component coil, multiple coils can acquire different parts of the image in parallel, thus allowing much faster imaging. The multiple demodulation circuitry is useful for multiple coil imaging when the overall FOV of interest in the readout direction is larger than the FOV achievable when the maximum gradient amplitude and maximum A/D sampling rate are utilized. For a 1.5T GE Signa system with 250 kHz maximum sampling rate and 40 mT/m maximum gradient amplitude, this corresponds to an overall FOV of interest of 14.68 cm or larger.

Consider now a simple 2DFT example. Assume the overall image FOV of interest is 30 cm in the x,y direction. If the multiple coil image reconstruction method of the invention is not used, the gradients have to be designed to encode 30 cm in both the x,y direction. However, with the multiple coil reconstruction of the present invention, one way of decreasing the scan time by a factor of four is through use of four coils with sensitivity regions approximately equal to 15 cm in the x,y direction. The coils can be placed on the lower left, lower right, upper left, and upper right part of the object to be imaged. In this case, gradient encoding can be limited to just 15 cm FOV in the x,y direction so that one-quarter of the image can be reconstructed from each coil. The four images are then pasted together to form a 30 cm FOV image. If a single demodulation channel is used for all coils without any linear phase unwrapping, the signal that is outside of the center 15 cm region in the readout direction for each coil will be filtered out. For each of the four coils, half of the signal in the readout direction that is within the overall region of interest will be completely filtered out.

The invention has been demonstrated using a GE 1.5T whole body scanner with a maximum gradient amplitude of 40 mT/m and maximum slew-rate of 150 mT/m/ms. The interleaved spiral trajectory was combined with a gradient-recalled echo sequence with a flip angle of 90°. Using the maximum gradient amplitude and the maximum sampling rate, the FOV achievable is 14.68 cm. Therefore, when the FOV of interest is larger than 14.68 cm, under-sampling in the readout direction can help reduce scan time when imaging with PILS. Data were acquired with a nominal FOV of 30×30 cm$^2$ and the resolution was 1×1 mm$^2$. TR was 18 ms. Readout duration was 9.1 ms. After digitally under-sampling, the FOV was 15×15 cm$^2$. A three-inch surface coil was used to image the object three times at different locations to simulate a phased array coil with localized sensitivity for each component coil.

FIG. 3A illustrates the sum of squares reconstruction of the image, FIG. 3B shows the PILS reconstruction with a single demodulation circuit, while FIG. 3C illustrates the image reconstruction using the present invention with under-sampling in both the readout direction and the interleaved spacing. The sum of squares reconstruction shows severe aliasing due to under-sampling and artifacts in the outer FOV region due to the anti-aliasing filter. The PILS reconstruction without the current invention shows artifacts in the outer FOV region due to anti-alias filtering. The image reconstructed using the invention shows no visible artifacts.

The use of multi-coil reconstruction of MRI signals with linear phase multiplication of coil signal to compensate for the offset and coil center of sensitivity in a multi-channel demodulator decreases scan time by approximately a factor of n when n is the number of coils in the array.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of magnetic resonance imaging signal reconstruction comprising the steps of:
    a) providing multiple receiver coils with each coil having a sensitivity region smaller than a total field of view for the image reconstruction,
    b) providing a separate dynamic demodulation channel for each coil according to parameters of each coil, including linear phase offset according to center location of signal sensitivity of each coil,
    c) processing demodulated signals from each channel to provide images having less than total field of view, and
    d) combining images from step c) to provide an image with total field of view.

2. The method as defined by claim 1 wherein signals from each coil are multiplied by a linear phase $$e^{i2\pi(f_0t+k_xx_i+k_yy_i+k_zz_i)}$$

where xi, yi, and zi are the centers of a sensitivity region for a coil, i, kx, ky, and kz are coil parameters and f0 is center frequency of the demodulation.

3. The method as defined by claim 2 wherein signals from coils traverse spiral k-space trajectories.

4. The method as defined by claim 3 wherein the spiral k-space trajectories are under-sampled.

5. The method as defined by claim 1 wherein signals from coils traverse spiral k-space trajectories.

6. The method as defined by claim 5 wherein the spiral k-space trajectories are under-sampled.

7. In partially parallel imaging with localized sensitivities (PILS) the improvement comprising:
    a) providing multiple receiver coils with each coil having a sensitivity region smaller than total field of view for the image reconstruction,
    b) providing a separate demodulation channel for each coil with signals from each coil being dynamically demodulated according to the localized sensitivity for the coil, including center of sensitivity region (xi, vi, zi) for coil, i,
    c) processing demodulated signals from each channel to provide images having less than total field of view, and
    d) combining images from step c) to provide an image with total field of view.

8. The method as defined by claim 7 wherein signals from each coil are multiplied by a linear phase $$e^{-i2\pi(x_ik_x+y_ik_y+z_ik_z)}$$

where xi, yi, and zi are the centers of a sensitivity region for a coil, i, kx, ky, and kz are coil parameters and f0 is center frequency of the demodulation.

9. The method as defined by claim 8 wherein signals from coils traverse spiral k-space trajectories.

10. The method as defined by claim 9 wherein the spiral k-space trajectories are under-sampled.

* * * * *